(12) United States Patent
Kono

(10) Patent No.: US 6,774,632 B2
(45) Date of Patent: Aug. 10, 2004

(54) FAILURE PREDICTION APPARATUS FOR SUPERCONDUCTIVE MAGNET AND MAGNETIC RESONANCE IMAGING SYSTEM

(75) Inventor: Kazuhiro Kono, Tokyo (JP)

(73) Assignee: GE Medical Systems Global Technology Company, LLC, Waukesha, WI (US)

( * ) Notice: Subject to any disclaimer, the term of this patent is extended or adjusted under 35 U.S.C. 154(b) by 0 days.

(21) Appl. No.: 10/243,785

(22) Filed: Sep. 13, 2002

(65) Prior Publication Data

US 2003/0052681 A1 Mar. 20, 2003

(30) Foreign Application Priority Data

Sep. 14, 2001 (JP) ........................................ 2001-279881

(51) Int. Cl.⁷ ................................................ G01V 3/00
(52) U.S. Cl. ...................................................... 324/318
(58) Field of Search ................................ 324/307–309, 324/318

(56) References Cited

U.S. PATENT DOCUMENTS

| | | | | |
|---|---|---|---|---|
| 5,150,578 A | * | 9/1992 | Oota et al. ..................... | 62/47.1 |
| 5,446,681 A | * | 8/1995 | Gethner et al. ................ | 702/27 |
| 5,504,331 A | | 4/1996 | Lane et al. | |
| 5,606,164 A | | 2/1997 | Price et al. | |
| 5,835,902 A | | 11/1998 | Jannarone | |
| 5,931,779 A | * | 8/1999 | Arakaki et al. ............. | 600/310 |
| 5,936,499 A | * | 8/1999 | Eckels ......................... | 335/216 |
| 6,157,041 A | | 12/2000 | Thomas et al. | |
| 6,272,233 B1 | | 8/2001 | Takeo | |
| 6,278,961 B1 | | 8/2001 | Kadtke et al. | |
| 6,289,330 B1 | | 9/2001 | Jannarone | |
| 6,295,485 B1 | | 9/2001 | Gleeson et al. | |
| 6,317,654 B1 | | 11/2001 | Gleeson et al. | |
| 6,438,440 B1 | | 8/2002 | Hayashi | |
| 6,441,388 B1 | | 8/2002 | Thomas et al. | |
| 6,516,282 B2 | * | 2/2003 | Hedlund et al. ............. | 702/132 |
| 6,567,685 B2 | * | 5/2003 | Takamori et al. ........... | 600/410 |
| 6,621,413 B1 | * | 9/2003 | Roman et al. ......... | 340/539.12 |

\* cited by examiner

*Primary Examiner*—Diego Gutierrez
*Assistant Examiner*—Dixomara Vargas
(74) *Attorney, Agent, or Firm*—Carl B. Horton, Esq.; Armstrong, Teasdale LLP

(57) ABSTRACT

In order to allow easy estimation of the operating condition of a magnet by a technician of any skill level, and to allow accurate prediction of a potential failure beforehand, a data processing section 52 is provided for resolving pressure data for a cooling helium gas, level (remaining amount) data for a liquid helium, first temperature data for a first stage of a refrigerator, second temperature data for a second stage of the refrigerator, and third temperature (room temperature) data for an equipment room 13 in which a compressor 40 is placed, as prespecified parameters, into a plurality of elements, using the elements as magnet data, calculating the Mahalanobis distance $D^2$ of the normalized magnet data, and comparing the calculated Mahalanobis distance $D^2$ with data stored in a database 53 obtained by developing magnet data in a normal condition into a Mahalanobis reference space to estimate the operating condition.

12 Claims, 14 Drawing Sheets

FRONT
(TABLE END)

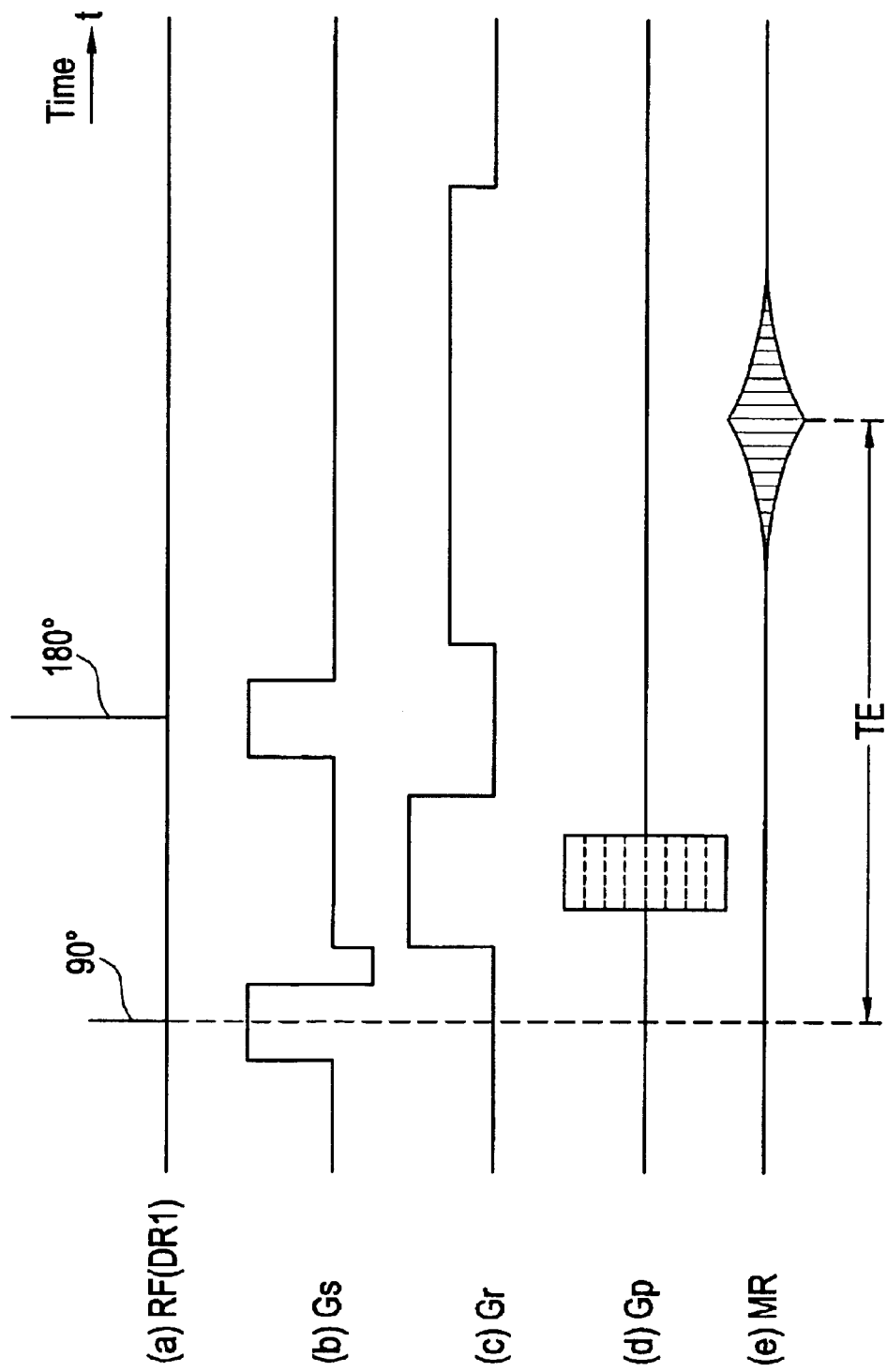

He Level
X1: He Level
X2: 12 hr moving average of X1 (w/Hanning window)
X3: Differential calculus of X1
X4: Moving average of X3
X5: Trend of moving average data, X2
X6: Differential calculus of X5
X7: Integral calculus of X5
X8: Integral calculus of X6
X9: 12 points means of X3
X10: Integral of X9
X11: SS of X9
X76: Long term (1 week) trend
X81: Long term Regression He level and He Gas Pressure.

2nd Stage Temperature
X12: 2nd Stage Temperature ... X22 : SS of X20
X77: Long term (1 week) trend 1st Stage Temperature
X23: 1st Stage Temperature ... X33 : SS of X31
X78: Long term (1 week) trend Machine Room Temperature
X34: Machine room Temperature ... X44 : SS of X42
X79: Long term (1 week) trend He Gas Temperature
X45: He gas pressure ... X75 : SS of X73
X80: Long term (1 week) trend

FIG. 9

Mahalanobis Space (Normal Operation Magnets' Data-base) : 26 X 26 Matrix

| Factor # | η (Best) | Selection |
|---|---|---|
| 2 | 0.359192 | ◎ |
| 3 | 0.140247 | × |
| 4 | 0.087758 | × |
| 5 | 0.014306 | △ |
| 8 | 0.049086 | △ |
| 10 | 0.127744 | ○ |
| 11 | 0.06866 | × |
| 13 | 0.253489 | ◎ |
| 14 | 0.020912 | △ |
| 15 | 0.007978 | × |
| 16 | 0.075005 | ○ |
| 19 | 0.019941 | × |
| 21 | 0.018653 | ○ |
| 22 | 0.04963 | × |
| 24 | 0.494698 | ◎ |
| 25 | 0.06706 | × |
| 30 | 0.037658 | × |
| 32 | 0.065356 | ○ |
| 33 | 0.032291 | ○ |
| 36 | 0.031433 | ○ |
| 38 | 0.071055 | ○ |
| 41 | 0.245788 | ◎ |
| 42 | 0.08061 | × |
| 43 | 0.005206 | △ |
| 44 | 0.02458 | × |
| 46 | 0.046159 | × |
| 47 | 0.101759 | ◎ |
| 48 | 0.286697 | ◎ |
| 52 | 0.127768 | ◎ |
| 54 | 0.280008 | ◎ |
| 55 | 0.061732 | × |
| 56 | 0.003709 | △ |
| 62 | 0.141991 | ◎ |
| 64 | 0.1273 | ○ |
| 67 | 0.028516 | × |
| 68 | 0.107942 | × |
| 71 | 0.212791 | ○ |
| 72 | 0.124945 | ○ |
| 75 | 0.046228 | △ |
| 79 | 0.215819 | × |
| 80 | 0.536561 | ◎ |
| 81 | 0.092513 | × |
| Δη with best selection of factors | 4.990774 | |

FAILURE PREDICTION APPARATUS FOR SUPERCONDUCTIVE MAGNET AND MAGNETIC RESONANCE IMAGING SYSTEM

CROSS REFERENCE TO RELATED APPLICATIONS

This application claims the benefit of Japanese Application No. 2001-279881 filed Sep. 14, 2001.

BACKGROUND OF THE INVENTION

The present invention relates to a failure prediction apparatus and method for predicting a failure of a superconductive magnet for forming a static magnetic field space employed in a magnetic resonance imaging apparatus, and a magnetic resonance imaging system employing such a failure prediction apparatus and method.

In magnetic resonance imaging processing, spins within a subject are excited by an excitation pulse for each TR, and a magnetic resonance signal generated by the excitation is collected in a two-dimensional Fourier space as a spin echo or gradient echo, for example.

The magnetic resonance signal is given different phase encoding for each "view", and echo data for a plurality of views are collected with positions on a phase axis differentiated in the two-dimensional Fourier space.

By applying a two-dimensional inverse Fourier transformation on the collected echo data for all the views, an image is reconstructed.

A magnetic resonance imaging apparatus for such magnetic resonance imaging processing comprises a magnet system having an internal cavity (bore) for receiving the subject.

The magnet system comprises a main magnetic field magnet for generating a static magnetic field in the bore, gradient coils for forming gradient magnetic fields to give gradients to the strength of the static magnetic field generated by the main magnetic field magnet, and an RF coil for generating a high frequency magnetic field for exciting the spins within the subject in the static magnetic field space formed by the main magnetic field magnet.

The main magnetic field magnet is made by using a superconductive magnet, for example.

For the magnetic resonance imaging apparatus employing the superconductive magnet, the operating condition of the superconductive magnet is estimated to conduct prediction of a potential failure that, upon occurrence, would cause the user significant loss.

The failure prediction is conducted by, for example, a magnet specialist by drawing graphs of detected data on the pressure of a cooling helium gas in the superconductive magnet, the helium level (remaining amount), the temperatures of first and second stages of a refrigerator, and the temperature of a room in which a compressor is placed, and checking these values, trends, relative relationship and variance or masking misinformation etc., to estimate the condition of the magnet.

As described above, the failure prediction of the superconductive magnet is a diagnosis that can be achieved only by a limited number of technicians who have appreciable experience and knowledge, and it is difficult for those less skilled in magnet technology to make the diagnosis.

Moreover, even technicians having experience and knowledge suffer from a disadvantage that it takes much time to obtain a large amount of information as described above to estimate the operating condition of the magnet.

SUMMARY OF THE INVENTION

Therefore, its object is to provide a failure prediction apparatus and method that allow easy estimation of the operating condition of a magnet by a technician of any skill level, and allow accurate prediction of a potential failure, and a magnetic resonance imaging system employing such a failure prediction apparatus and method.

The present invention, in its first aspect for achieving the aforementioned object, is a failure prediction apparatus for predicting a failure of a superconductive magnet for forming a static magnetic field space employed in a magnetic resonance imaging apparatus, comprising: a pressure sensor for detecting a pressure of a cooling medium in said superconductive magnet; a level sensor for detecting a level of said cooling medium; a first temperature sensor for detecting a temperature of a predefined portion of a refrigerator; a second temperature sensor for detecting a temperature of a room in which a compressor is placed for cooling the cooling medium from said refrigerator and supplying the cooling medium to said refrigerator; and calculating means for calculating a Mahalanobis distance of magnet data including, as prespecified parameters, the pressure of the cooling medium detected by said pressure sensor, the level of the cooling medium detected by said level sensor, the temperature of the refrigerator detected by said first temperature sensor, and the room temperature detected by said second temperature sensor for determining whether the magnet is normal or not.

In the first aspect of the present invention, said calculating means resolves the pressure of the cooling medium detected by said pressure sensor, the level of the cooling medium detected by said level sensor, the temperature of the refrigerator detected by said first temperature sensor, and the room temperature detected by said second temperature sensor, as the prespecified parameters, into a plurality of elements, normalizes the elements to form magnet data, and calculates the Mahalanobis distance of the normalized magnet data for determining whether the magnet is normal or not.

Moreover, in the first aspect of the present invention, the apparatus comprises: a database storing data obtained by developing magnet data previously sampled from a normally operating magnet including, as prespecified parameters, a pressure of the cooling medium detected by said pressure sensor, a level of the cooling medium detected by said level sensor, a temperature of the refrigerator detected by said first temperature sensor, and a room temperature detected by said second temperature sensor, into a Mahalanobis reference space; and means for determining whether the operating condition of the superconductive magnet is normal or not by comparing the Mahalanobis distance obtained by said calculating means with the stored data in said database.

Furthermore, in the first aspect of the present invention, the apparatus comprises: a database storing data obtained by resolving magnet data previously sampled from a normally operating magnet including, as prespecified parameters, a pressure of the cooling medium detected by said pressure sensor, a level of the cooling medium detected by said level sensor, a temperature of the refrigerator detected by said first temperature sensor, and a room temperature detected by said second temperature sensor, into a plurality of elements, and developing the resolved magnet data comprised of the plurality of elements into a Mahalanobis reference space; and means for determining whether the operating condition of the superconductive magnet is normal or not by comparing the Mahalanobis distance obtained by said calculating means with the stored data in said database.

The present invention, in its second aspect, is a failure prediction apparatus for predicting a failure of a superconductive magnet for forming a static magnetic field space employed in a magnetic resonance imaging apparatus, comprising: a pressure sensor for detecting a pressure of a cooling medium in said superconductive magnet; a level sensor for detecting a level of said cooling medium; first and second temperature sensors for detecting temperatures of a plurality of portions of a refrigerator; a third temperature sensor for detecting a temperature of a room in which a compressor is placed for cooling the cooling medium from said refrigerator and supplying the cooling medium to said refrigerator; and calculating means for calculating a Mahalanobis distance of magnet data including, as prespecified parameters, the pressure of the cooling medium detected by said pressure sensor, the level of the cooling medium detected by said level sensor, the temperatures of the plurality of portions of the refrigerator detected by said first and second temperature sensors, and the room temperature detected by said third temperature sensor for determining whether the magnet is normal or not.

In the second aspect of the present invention, said calculating means resolves the pressure of the cooling medium detected by said pressure sensor, the level of the cooling medium detected by said level sensor, the temperatures of the plurality of portions of the refrigerator detected by said first and second temperature sensors, and the room temperature detected by said third temperature sensor, as the prespecified parameters, into a plurality of elements, normalizes the elements to form magnet data, and calculates the Mahalanobis distance of the normalized magnet data for determining whether the magnet is normal or not.

Moreover, in the second aspect of the present invention, the apparatus comprises: a database storing data obtained by developing magnet data previously sampled from a normally operating magnet including, as prespecified parameters, a pressure of the cooling medium detected by said pressure sensor, a level of the cooling medium detected by said level sensor, temperatures of the plurality of portions of the refrigerator detected by said first and second temperature sensors, and a room temperature detected by said third temperature sensor, into a Mahalanobis reference space; and means for determining whether the operating condition of the superconductive magnet is normal or not by comparing the Mahalanobis distance obtained by said calculating means with the stored data in said database.

Furthermore, in the second aspect of the present invention, the apparatus comprises: a database storing data obtained by resolving magnet data previously sampled from a normally operating magnet including, as prespecified parameters, a pressure of the cooling medium detected by said pressure sensor, a level of the cooling medium detected by said level sensor, temperatures of the plurality of portions of the refrigerator detected by said first and second temperature sensors, and a room temperature detected by said third temperature sensor, into a plurality of elements, and developing the resolved magnet data comprised of the plurality of elements into a Mahalanobis reference space; and means for determining whether the operating condition of the superconductive magnet is normal or not by comparing the Mahalanobis distance obtained by said calculating means with the stored data in said database.

The present invention, in its third aspect, is a failure prediction method of predicting a failure of a superconductive magnet for forming a static magnetic field space employed in a magnetic resonance imaging apparatus, comprising the steps of: detecting a pressure of a cooling medium in said superconductive magnet, a level of said cooling medium, a temperature of a predefined portion of a refrigerator, and a temperature of a room in which a compressor is placed for cooling the cooling medium from said refrigerator and supplying the cooling medium to said refrigerator; and calculating a Mahalanobis distance of magnet data including, as prespecified parameters, the detected pressure of the cooling medium, level of the cooling medium, temperature of the refrigerator, and temperature of the room in which the compressor is placed for determining whether the magnet is normal or not.

In the third aspect of the present invention, said step of calculating a Mahalanobis distance comprises: resolving the pressure of the cooling medium, the level of the cooling medium, the temperature of the predefined portion of the refrigerator, and the temperature of the room in which the compressor is placed, as the prespecified parameters, into a plurality of elements, normalizing the elements to form magnet data, and calculating the Mahalanobis distance of the normalized magnet data for determining whether the magnet is normal or not.

Moreover, in the third aspect of the present invention, the method comprises: comparing data in a database obtained by developing magnet data previously sampled from a normally operating magnet including, as prespecified parameters, a pressure of the cooling medium, a level of the cooling medium, a temperature of the predefined portion of the refrigerator, and a temperature of the room in which the compressor is placed, into a Mahalanobis reference space, with the Mahalanobis distance obtained at said step of calculating a Mahalanobis distance to determine whether the operating condition of the superconductive magnet is normal or not.

Furthermore, in the third aspect of the present invention, the method comprises: comparing data in a database obtained by resolving magnet data previously sampled from a normally operating magnet including, as prespecified parameters, a pressure of the cooling medium, a level of the cooling medium, a temperature of the predefined portion of the refrigerator, and a temperature of the room in which the compressor is placed, into a plurality of elements, and developing the resolved magnet data comprised of the plurality of elements into a Mahalanobis reference space, with the Mahalanobis distance obtained at said step of calculating a Mahalanobis distance to determine whether the operating condition of the superconductive magnet is normal or not.

The present invention, in its fourth aspect, is a failure prediction method of predicting a failure of a superconductive magnet for forming a static magnetic field space employed in a magnetic resonance imaging apparatus, comprising the steps of: detecting a pressure of a cooling medium in said superconductive magnet, a level of said cooling medium, temperatures of a plurality of portions of a refrigerator, and a temperature of a room in which a compressor is placed for cooling the cooling medium from said refrigerator and supplying the cooling medium to said refrigerator; and calculating a Mahalanobis distance of magnet data including, as prespecified parameters, the detected pressure of the cooling medium, level of the cooling medium, temperatures of the plurality of portions of the refrigerator, and temperature of the room in which the compressor is placed for determining whether the magnet is normal or not.

In the fourth aspect of the present invention, said step of calculating a Mahalanobis distance comprises: resolving the pressure of the cooling medium, the level of the cooling medium, the temperatures of the plurality of portions of the refrigerator, and the temperature of the room in which the compressor is placed, as the prespecified parameters, into a plurality of elements, normalizing the elements to form magnet data, and calculating the Mahalanobis distance of the normalized magnet data for determining whether the magnet is normal or not.

Moreover, in the fourth aspect of the present invention, the method comprises: comparing data in a database obtained by developing magnet data previously sampled from a normally operating magnet including, as prespecified parameters, a pressure of the cooling medium, a level of the cooling medium, temperatures of the plurality of portions of the refrigerator, and a temperature of the room in which the compressor is placed, into a Mahalanobis reference space, with the Mahalanobis distance obtained at said step of calculating a Mahalanobis distance to determine whether the operating condition of the superconductive magnet is normal or not.

Furthermore, in the fourth aspect of the present invention, the method comprises: comparing data in a database obtained by resolving magnet data previously sampled from a normally operating magnet including, as prespecified parameters, a pressure of the cooling medium, a level of the cooling medium, temperatures of the predefined portions of the refrigerator, and a temperature of the room in which the compressor is placed, into a plurality of elements, and developing the resolved magnet data comprised of the plurality of elements into a Mahalanobis reference space, with the Mahalanobis distance obtained at said step of calculating the Mahalanobis distance to determine whether the operating condition of the superconductive magnet is normal or not.

The present invention, in its fifth aspect, is a magnetic resonance imaging system employing a superconductive magnet for forming a static magnetic field space, receiving a subject into said static magnetic field, and imaging a region to be examined in the subject using magnetic resonance, comprising a failure prediction apparatus for the superconductive magnet, including: a pressure sensor for detecting a pressure of a cooling medium in said superconductive magnet; a level sensor for detecting a level of said cooling medium; a first temperature sensor for detecting a temperature of a predefined portion of a refrigerator; a second temperature sensor for detecting a temperature of a room in which a compressor is placed for cooling the cooling medium from said refrigerator and supplying the cooling medium to said refrigerator; and calculating means for calculating a Mahalanobis distance of magnet data including, as prespecified parameters, the pressure of the cooling medium detected by said pressure sensor, the level of the cooling medium detected by said level sensor, the temperature of the refrigerator detected by said first temperature sensor, and the room temperature detected by said second temperature sensor for determining whether the magnet is normal or not.

The present invention, in its sixth aspect, is a magnetic resonance imaging system employing a superconductive magnet for forming a static magnetic field space, receiving a subject into said static magnetic field, and imaging a region to be examined in the subject using magnetic resonance, comprising a failure prediction apparatus for the superconductive magnet including: a pressure sensor for detecting a pressure of a cooling medium in said superconductive magnet; a level sensor for detecting a level of said cooling medium; first and second temperature sensors for detecting temperatures of a plurality of portions of a refrigerator; a third temperature sensor for detecting a temperature of a room in which a compressor is placed for cooling the cooling medium from said refrigerator and supplying the cooling medium to said refrigerator; and calculating means for calculating a Mahalanobis distance of magnet data including, as prespecified parameters, the pressure of the cooling medium detected by said pressure sensor, the level of the cooling medium detected by said level sensor, the temperatures of the plurality of portions of the refrigerator detected by said first and second temperature sensors, and the room temperature detected by said third temperature sensor for determining whether the magnet is normal or not.

According to the present invention, the calculating means is supplied with, for example, data on a pressure of a cooling medium detected by a pressure sensor, data on a level (remaining amount) of the cooling medium detected by a level sensor, data on a first temperature of, for example, a first stage of a refrigerator detected by a first temperature sensor, data on a second temperature of a second stage of the refrigerator detected by a second temperature sensor, data on a third temperature (room temperature) of a room in which a compressor is placed detected by a third temperature sensor.

The calculating means calculates a Mahalanobis distance of magnet data including, as prespecified parameters, the supplied pressure data for the cooling medium, level data for the cooling medium, first and second temperature data for the plurality of portions of the refrigerator and room temperature data, for example.

Alternatively, the calculating means resolves the supplied pressure data for the cooling medium, level data for the cooling medium, first and second temperature data for the plurality of portions of the refrigerator and room temperature data, as the prespecified parameters, for example, into a plurality of elements, normalizes the elements to form magnet data, and calculates the Mahalanobis distance of the normalized magnet data.

Then, the calculated Mahalanobis distance is compared with stored data in a database obtained by developing magnet data previously sampled from a normally operating magnet into a Mahalanobis reference space to determine whether the operating condition of the superconductive magnet is normal or not.

Therefore, the present invention allows easy estimation of the operating condition of a magnet by a technician of any skill level.

Consequently, there is provided the advantage that a potential failure can be accurately predicted beforehand.

Further objects and advantages of the present invention will be apparent from the following description of the preferred embodiments of the invention as illustrated in the accompanying drawings.

BRIEF DESCRIPTION OF THE DRAWINGS

FIG. 7 is a timing chart for explaining a pulse sequence according to a spin echo technique.

FIG. 8 shows exemplary elements developed by a data processing section in a central management center in accordance with the embodiment.

FIG. 9 shows exemplary data stored in a database developed into a Mahalanobis reference space.

FIG. 10 shows the Taguchi-SNR($\eta$) value for predetermined factors corresponding to the data shown in FIG. 9, and also shows exemplary determination criterion.

DETAILED DESCRIPTION OF THE INVENTION

A magnetic resonance imaging system in accordance with the present invention will now be described with reference to the accompanying drawings.

Figure 1:
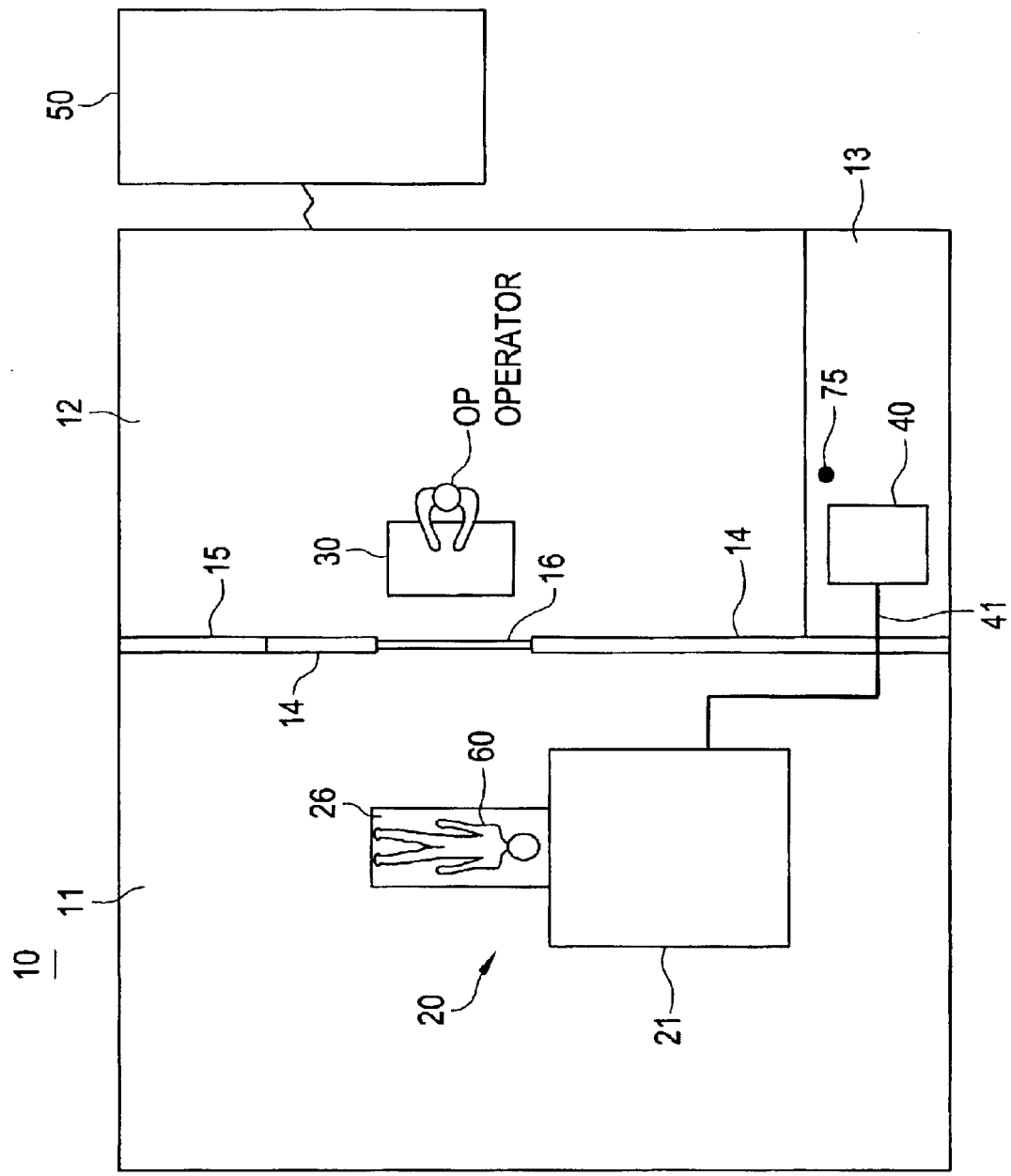
FIG. 1 is a diagram for explaining the layout of a magnetic resonance imaging system employing a failure prediction apparatus for a superconductive magnet in accordance with the present invention.
Figure 2:
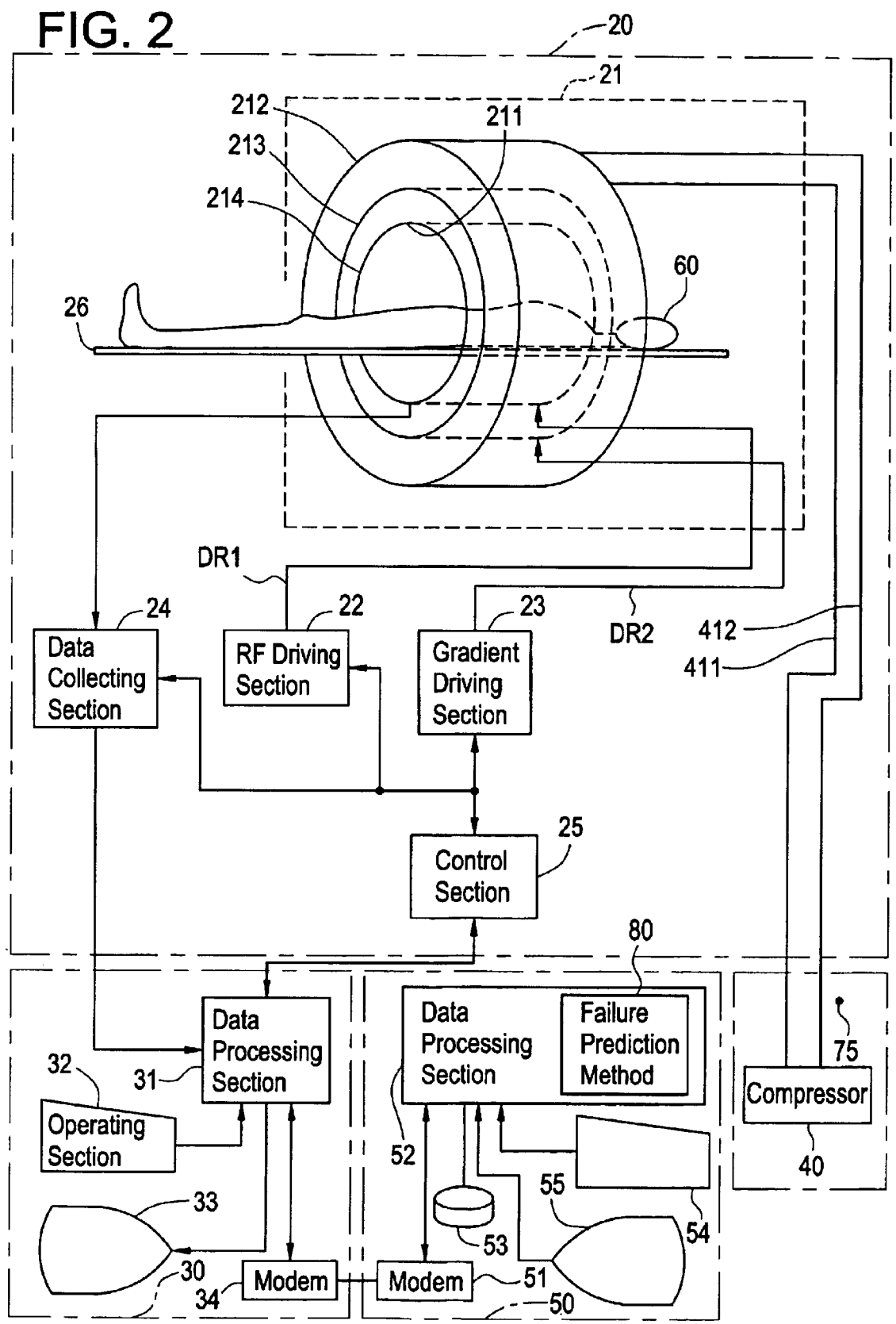
FIG. 2 is a configuration diagram showing an embodiment of an MRI system in accordance with the present invention.

FIG. 1 is a diagram for explaining the layout of a magnetic resonance imaging (MRI) system employing a failure prediction apparatus for a superconductive magnet in accordance with the present invention, and FIG. 2 is a configuration diagram illustrating one embodiment of the MRI system in accordance with the present invention.

In the MRI system 10 in accordance with the present invention, an MRI apparatus 20 is disposed in a scan room 11 that forms a closed space for preventing leakage of electromagnetic radiation emitted by a magnet and entrance of disturbing electromagnetic radiation, and an operator console 30 operated by a human operator OP is disposed in an operation room 12 adjacent to the scan room 11, as shown in FIG. 1

An equipment room 13 is located adjacent to the operation room 12, and a compressor 40 is installed in the equipment room 13 for cooling and supplying a helium (He) gas that is a cooling medium (cryogen) for a superconductive magnet section for generating a static magnetic field, which will be described later.

The scan room 11 and the operation room 12 are partitioned by a wall 14 having a door 15 and a window glass 16.

The compressor 40 placed in the equipment room 13 is connected with a cryogen passage 41 (actually comprising two paths: a cryogen supply path and a cryogen return path) for introducing the cryogen, for example, to the magnet system 21 of the MRI apparatus 20 placed in the scan room 11 and returning the warmed cryogen to compressor 40.

The operator console 30 exchanges information with, for example, a central management center 50 via a modem. For example, the operator console 30 transmits to the central management center 50 information on the pressure of the cooling medium in the superconductive magnet, the level (remaining amount) of the cooling medium, the temperatures of two portions of a refrigerator, and the temperature (room temperature) of the equipment room 13 in which the compressor is placed, for use in estimating the operating condition of the superconductive magnet.

The MRI apparatus 20, operator console 30, compressor 40 and central management center 50 will be described one by one hereinbelow.

The MRI apparatus 20 has a magnet system 21, an RF driving section 22, a gradient driving section 23, a data collecting section 24, a control section 25 and a cradle 26, as shown in FIG. 2.

The magnet system 21 has a generally cylindrical internal cavity (bore) 211, as shown in FIG. 2, and the cradle 26 on which a subject 60 is rested with a cushion underlaid is carried into the bore 211 by a carrier section (not shown).

The magnet system 21 includes therein a main magnetic field magnet section 212, a gradient coil section 213, and an RF coil section 214 disposed around a magnet center (a central position for scanning) in the bore 211, as shown in FIG. 2.

The main magnetic field magnet section 212, gradient coil section 213, and RF coil section 214 each comprise a pair of coils facing each other across the space in the bore 211 in which the subject 60 is positioned on examination.

A main magnetic field magnet of the main magnetic field magnet section 212 is made by using a superconductive magnet, for example.

An exemplary arrangement of the main magnetic field magnet section 212 in the magnet system 21 in accordance with the present invention will now be described with reference to the accompanying drawings.

Figure 3:
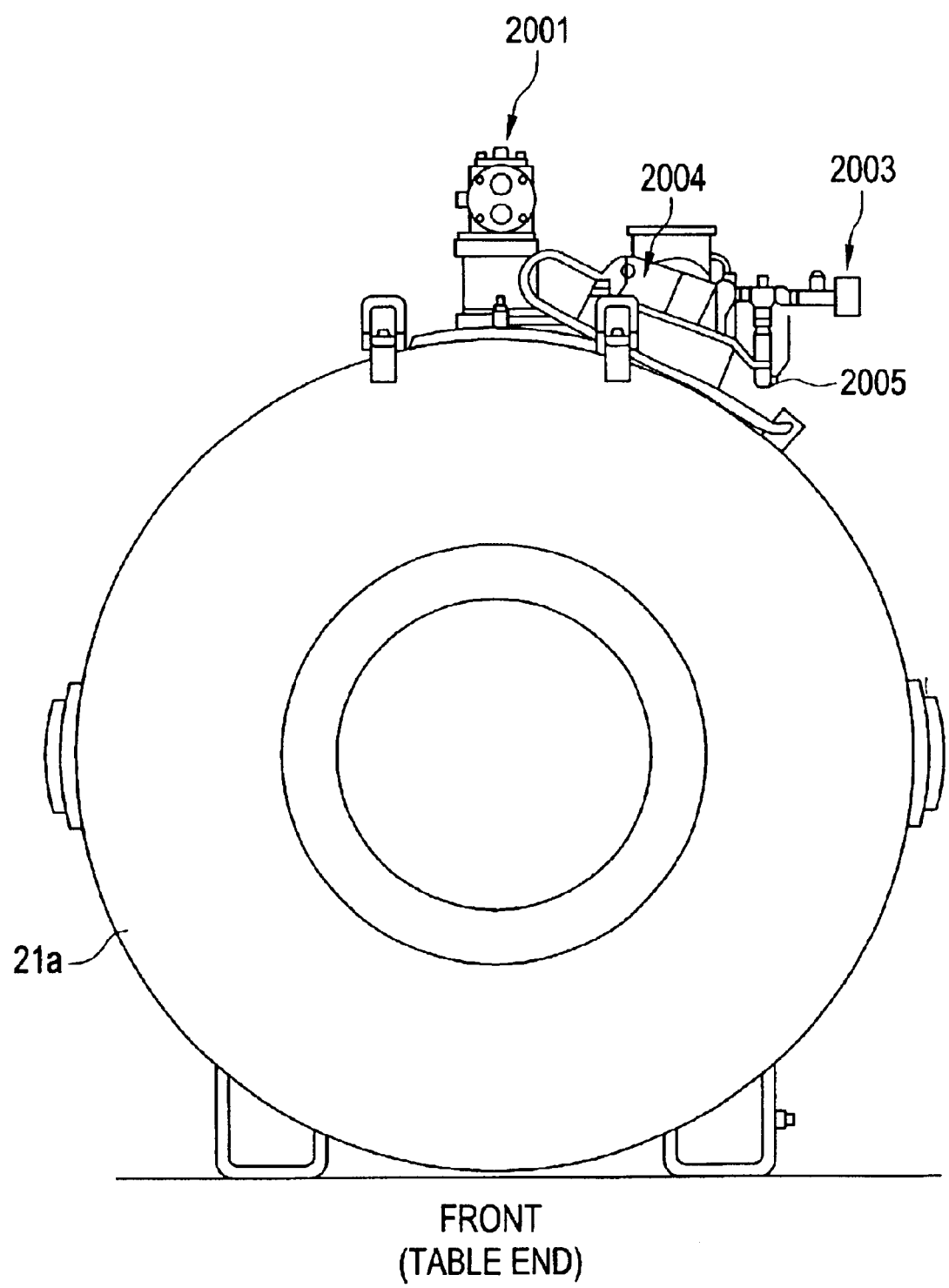
FIG. 3 is a front elevational view showing an exemplary arrangement of a main magnetic field magnet section in a magnet system in accordance with the embodiment.
Figure 4:
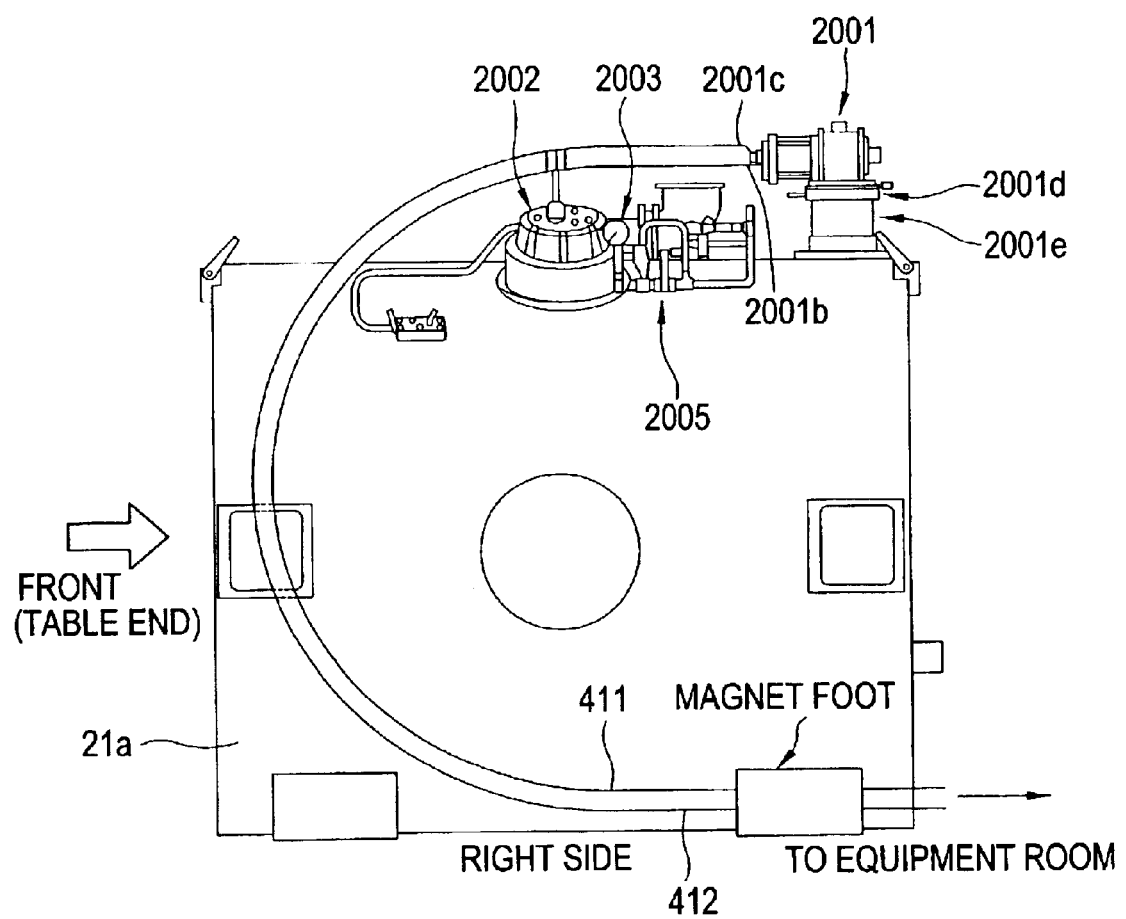
FIG. 4 is a side view showing the exemplary arrangement of the main magnetic field magnet section in the magnet system in accordance with the embodiment.

FIG. 3 is a front elevational view showing an exemplary arrangement of the main magnetic field magnet section 212 in the magnet system 21 in accordance with the present invention, and FIG. 4 is a side view showing the exemplary arrangement of the main magnetic field magnet section 212 in the magnet system 21 in accordance with the present invention.

The main magnetic field magnet section 212 is fixedly attached at predefined locations in the upper portion of a cylindrical housing (table end flange) 21a of the magnet system 21 with a refrigerator 2001, a passive heater 2002, a pressure gauge 2003, a service turret 2004 and a helium vent valve 2005 for the cryogen helium, as shown in FIGS. 3 and 4.

A cold head 2001a, (shown in FIG. 6), of the refrigerator 2001 comprises a head 2001b connected with one end of the cryogen supply path 411, the other end of which path is connected to the compressor 40 placed in the equipment room 13, and a head 2001c connected with one end of the cryogen return path 412, the other end of which path is connected to the compressor 40.

The refrigerator 2001 comprises a first stage 2001d for adiabatically expanding the supplied helium gas, and a second stage 2001e for cooling the helium gas vaporized by the adiabatic expansion to bring it back to the liquid helium, which is supplied to a region of the housing 21a in which the superconductive magnet is placed.

Figure 5:
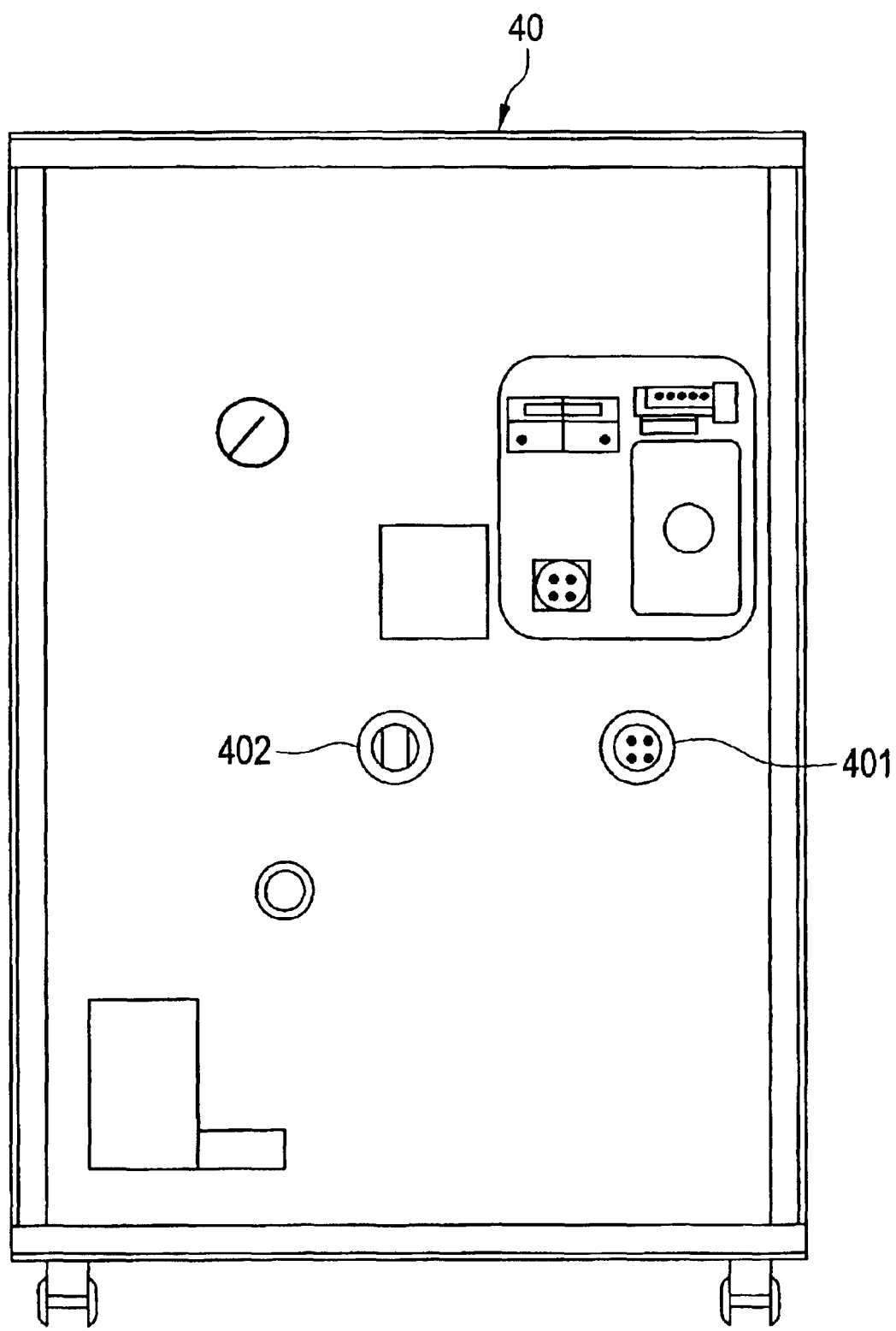
FIG. 5 is an exterior view of a compressor placed in an equipment room.

FIG. 5 is an exterior view of the compressor 40 placed in the equipment room 13.

The compressor 40 is of the water- or air-cooled type and is provided at the front surface with a helium supply outlet 401 connected with the aforesaid other end of the cryogen supply path 411, and a helium return inlet 402 connected with the aforesaid other end of the cryogen return path 412, as exemplarily shown in FIG. 5.

Figure 6:
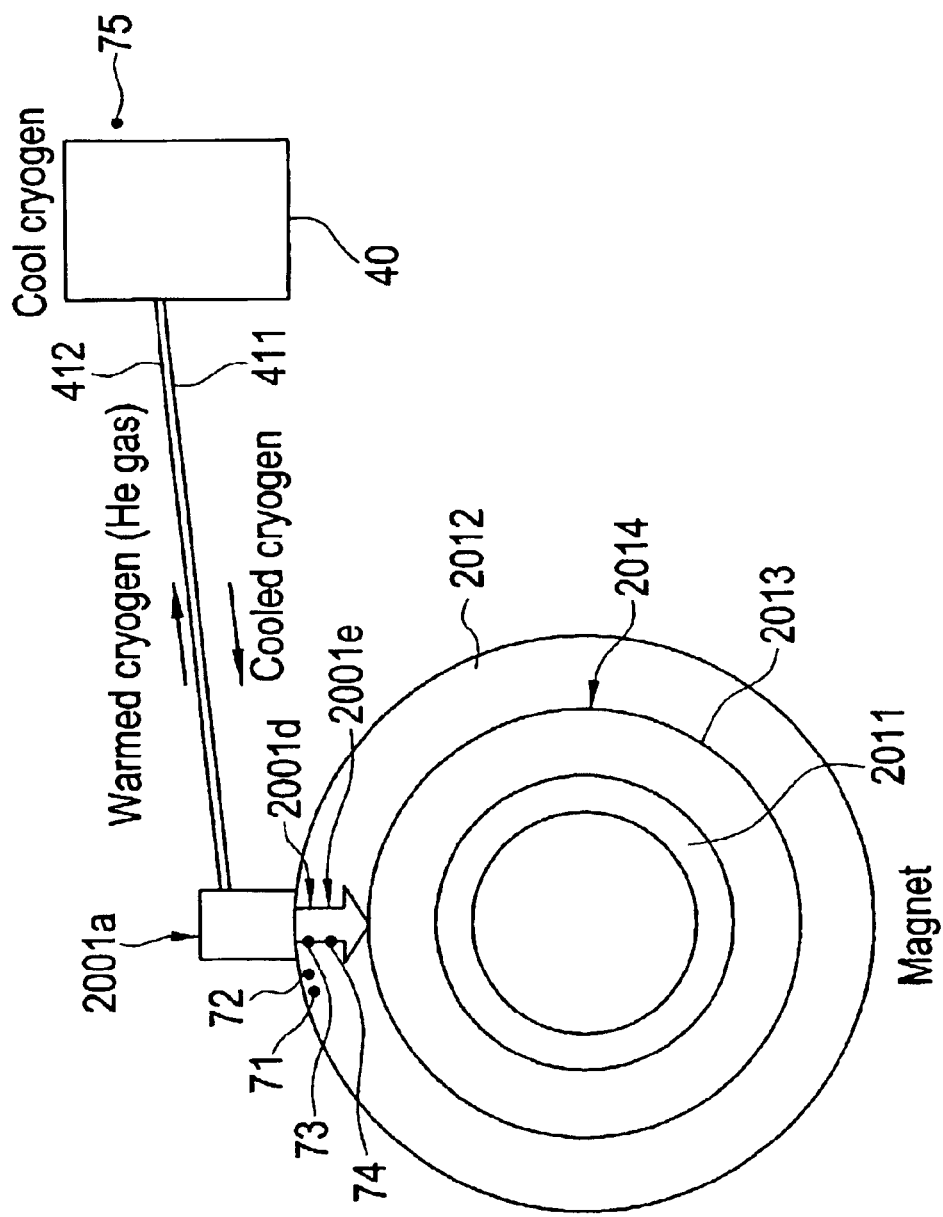
FIG. 6 is a diagram for explaining the configuration of the main magnetic field magnet section employing a superconductive magnet, and a cooling system.

FIG. 6 is a diagram for explaining the configuration of the main magnetic field magnet section 212 employing such a superconductive magnet, and a cooling system.

The magnet is provided with a superconductive coil shaped to be interposed between a central vacuum section 2011 and a peripheral vacuum section 2012 that are concentrically formed, and the liquid helium 2014 is charged in a region 2013 in which the superconductive coil is located.

In such a configuration, the cryogen helium cooled by the compressor 40 is supplied to the cold head 2001a of the refrigerator 2001 via the cryogen supply path 411.

The supplied helium gas is adiabatically expanded at the first stage 2001d in the cold head 2001a. At this time, the vessel itself is cooled.

The helium vaporized in the vessel is cooled at the second stage 2001e back to the liquid helium, and it is supplied to the region 2013 in which the superconductive coil is located.

The temperature of the liquid helium is −268.8° C.

When cooled by the liquid helium, the superconductive coil becomes superconductive, enabling it to pass electric current at low resistance and thereby generate the static magnetic field in the bore 211.

The warmed helium gas that has been used for the cooling is returned from the cold head 2001a to the compressor 40 via the cryogen return path 412.

Thus, the main magnetic field magnet section 212 generates the static magnetic field in the bore 211. The direction of the static magnetic field is, for example, generally parallel to the direction of the body axis of the subject 50. That is, a parallel magnetic field is generated.

For the magnetic resonance imaging system employing the superconductive magnet, it is necessary to sample data needed to estimate the operating condition of the superconductive magnet, and to conduct prediction of a potential failure that, upon occurrence, would cause the user significant loss.

The present embodiment employs, as failure prediction data, detected data on the pressure of the cooling helium gas in the superconductive magnet, the level (remaining amount) of the helium, the temperatures of the first and second stages of the refrigerator, and the room temperature of the equipment room 13 in which the compressor is placed, which will be described later.

Accordingly, there are provided at predefined locations a pressure sensor 71 for detecting the pressure of the cooling helium gas in the superconductive magnet, a level sensor 72 for detecting the level (remaining amount) of the liquid helium, a first temperature sensor for detecting the temperature of the first stage 2001d of the refrigerator 2001, a second temperature sensor 74 for detecting the temperature of the second stage 2001e of the refrigerator 2001, and a third temperature sensor 75 for detecting the temperature of the equipment room 13 in which the compressor is placed, and the detected data from these sensors are input to a data processing section 31 in the operator console 30.

The pressure data for the cooling helium gas detected by the pressure sensor 71, level (remaining amount) data for the liquid helium detected by the level sensor 72, first temperature data for the first stage of the refrigerator detected by the first temperature sensor 73, second temperature data for the second stage of the refrigerator detected by the second temperature sensor 74, and third temperature (room temperature) data for the room in which the compressor 40 is placed detected by the third temperature sensor 75, all of which are input to the data processing section 31, are transmitted to the central management center 50 via the modem.

The pressure sensor 71 and level sensor 72 are placed within the service turret 2004, for example, the first temperature sensor 73 is placed at the first stage 2001d, the second temperature sensor 74 is placed at the second stage 2001e, and the third temperature sensor 75 is placed in the equipment room 13.

The gradient coil section 213 generates gradient magnetic fields for imparting respective gradients to the strength of the static magnetic field generated by the main magnetic field magnet section 212 to incorporate three-dimensional position information into a magnetic resonance signal received by the RF coil section 214.

The gradient magnetic fields generated by the gradient coil section 213 are the following three: a slice gradient magnetic field, a readout gradient magnetic field and a phase encoding gradient magnetic field, and the gradient coil section 213 has three gradient coils corresponding these three gradient magnetic fields.

The RF coil section 214 generates a high frequency magnetic field for exciting spins within the subject 60 in the static magnetic field space formed by the main magnetic field magnet section 212. The generation of the high frequency magnetic field will be sometimes referred to as transmission of an RF excitation signal hereinbelow. The RF coil section 214 also receives electromagnetic wave generated by the excited spins as a magnetic resonance signal.

The RF coil section 214 has transmitting and receiving coils, which are not shown. For the transmitting and receiving coils, the same coil or separate dedicated coils may be used.

The RF driving section 22 supplies the RF coil section 214 with a driving signal DR1 in accordance with a protocol based on a command from the control section 25 to generate an RF excitation signal, thereby exciting the spins within the subject 60.

The gradient driving section 23 supplies the gradient coil section 213 with a driving signal DR2 in accordance with the protocol based on the command from the control section 25 to generate the gradient magnetic fields. The gradient driving section 23 has three driving circuits (not shown) corresponding to the three gradient coils in the gradient coil section 213.

The data collecting section 24 gathers the signal received by the RF coil section 214, collects the signal as view data, and outputs the data to the data processing section 31 in the operator console 30. The control section 25 controls the RF driving section 22 to apply to the RF coil section 214 the driving signal DR1 for repeating a predetermined pulse sequence a predetermined number of times in a predetermined repetition time TR, based on the protocol to be executed corresponding to the region to be examined in the subject 60 sent by the data processing section 31 in the operator console 30.

Similarly, the control section 25 controls the gradient driving section 23 to apply to the gradient coils 213 a pulse signal of a predetermined pattern in 1TR based on the protocol to be executed.

The control section 25 also controls the data collecting section 24 to gather the signal received by the RF coil section 214, collect the signal as view data, and output the data to the data processing section 31 in the operator console 30.

The protocol to be executed that is specified by the control section 25 is determined corresponding to the region to be examined in the subject 60 to achieve magnetic resonance imaging, and each protocol has a different number of times of the pulse sequence repetition within 1TR (repetition time).

The magnetic resonance imaging pulse sequence varies according to the imaging technique, such as a "spin echo" (SE), a "gradient echo" (GRE), a "fast spin echo" (FSE), a "fast recovery FSE", and an "echo planar imaging" (EPI).

Among the pulse sequences of the imaging techniques, an SE pulse sequence will now be described with reference to FIG. 7.

FIG. 7($a$) is a sequence of 90° and 180° pulses for RF excitation in the SE technique, and corresponds to the driving signal DR1 applied to the RF coil section 214 by the RF driving section 22.

FIGS. 7($b$), ($c$), ($d$) and ($e$) are sequences of a slice gradient Gs, a readout gradient Gr, a phase encoding gradient Gp and a spin echo MR, respectively. The pulses for the slice gradient Gs, readout gradient Gr and phase encoding gradient Gp correspond to the driving signal DR2 applied to the gradient coil section 213 by the gradient driving section 23.

As shown in FIG. 7($a$), the RF driving section 22 applies the 90° pulse to the RF coil section 214 to achieve 90° excitation of the spins. At the time of the 90° excitation, the gradient driving section 23 applies the slice gradient pulse Gs to the gradient coil section 213, as shown in FIG. 7($b$), to achieve selective excitation of a certain slice.

As shown in FIG. 7($a$), after a predetermined time from the 90° excitation, the RF driving section 22 applies a 180° pulse to the RF coil section 214 to achieve 180° excitation, i.e., spin inversion. Again, at this time, the gradient driving section 23 applies the slice gradient pulse Gs to the gradient coil section 213, as shown in FIG. 7($b$), to achieve selective inversion of the same slice.

As shown in FIGS. 7($c$) and ($d$), the gradient driving section 23 applies the readout gradient pulse Gr and the phase encoding gradient pulse Gp to the gradient coil section 213 in the period between the 90° excitation and spin inversion.

Then, the readout gradient pulse Gr dephases the spins, and the phase encoding gradient pulse Gp phase-encodes the spins.

After the spin inversion, the gradient driving section 23 applies the readout gradient pulse Gr to the gradient coil section 213, as shown in FIG. 7($c$), and the spins are rephased to generate a spin echo MR, as shown in FIG. 7($e$).

The spin echo MR is collected as view data by the data collecting section 24.

The control section 25 controls the RF driving section 22, gradient driving section 23 and data collecting section 24 to repeat such a pulse sequence 64–512 times, for example, in a cycle of TR according to the executed protocol. The control section 25 conducts the control so that the phase encoding gradient pulse Gp is changed for each repetition to impart different phase encoding each time.

The operator console 30 comprises the data processing section 31, an operating section 32, a display section 33 and a modem 34, as shown in FIG. 2.

The data processing section 31 stores data gathered from the data collecting section 24 in a memory. A data space is formed in the memory. The data space formed in the memory, constitutes a two-dimensional Fourier space.

The data processing section 31 performs two-dimensional inverse Fourier transformation on the data in the two-dimensional Fourier space to produce (reconstruct) an image of the subject 60.

The two-dimensional Fourier space is sometimes referred to as a k-space.

The data processing section 31 is connected with the control section 25, and the section 31 is above the control section 25 and controls it.

The data processing section 31 is also connected with the operating section 32, display section 33 and modem 34.

The operating section 32 is comprised of a keyboard with pointing device, and a mouse etc., and outputs an operation signal in response to the operation by the operator OP to the data processing section 31. The operating section 32 also receives input of the aforementioned protocol to be executed, for example. The data processing section 31 supplies information on the protocol input from the operating section 32 (e.g., protocol number) to the control section 25.

The display section 33 is comprised of a graphic display, for example, and displays certain information according to the operating condition of the MRI apparatus 20 in response to the operation signal from the operating section 32.

The modem 34 transmits the pressure data for the cooling helium gas detected by the pressure sensor 71, level (remaining amount) data for the liquid helium detected by the level sensor 72, first temperature data for the first stage of the refrigerator detected by the first temperature sensor 73, second temperature data for the second stage of the refrigerator detected by the second temperature sensor 74, and third temperature (room temperature) data for the equipment room 13 in which the compressor 40 is placed detected by the third temperature sensor 75, all of which are input to the data processing section 31, to the central management center 50.

Moreover, the modem 34 receives information on, for example, maintenance, transmitted by the central management center 50 and supplies it to the data processing section 31.

The central management center 50 comprises a modem 51, a data processing section 52, which constitutes the calculating means and comparing and determining means of the present invention, a database 53, an operating section 54 and a display section 55, as shown in FIG. 2.

The modem 51 supplies the data processing section 52 with the pressure data for the cooling helium gas, level (remaining amount) data for the liquid helium, first temperature data for the first stage of the refrigerator, second temperature data for the second stage of the refrigerator, and third temperature (room temperature) data for the equipment room 13 in which the compressor 40 is placed, all of which are transmitted by the operator console 30.

Moreover, the modem 51 transmits information on maintenance etc. given by the data processing section 52 to the operator console 30.

The data processing section 52 retains the pressure data for the cooling helium gas, level (remaining amount) data for the liquid helium, first temperature data for the first stage of the refrigerator, second temperature data for the second stage of the refrigerator, and third temperature (room temperature) data for the equipment room 13 in which the compressor 40 is placed, in a FIFO or other such memory for a certain time (e.g., several tens—several hundreds of hours); and executes a failure prediction method 80 for predicting a failure of a superconducting magnet. When executing the method, the data processing section 52 resolves the data as prespecified parameters into a plurality of (j, e.g., several tens of) elements; and generates a matrix having the elements as magnet data, as given by Eq. (1).

$$A = \begin{pmatrix} 1 & X_{12} & X_{13} & \ldots & X_{1n} \\ X_{21} & 1 & X_{23} & \ldots & X_{2n} \\ \vdots & \vdots & \vdots & & \\ X_{j1} & X_{j2} & X_{j3} & \ldots & 1 \end{pmatrix} \quad (1)$$

In Eq. (1), $X_{11}$-$X_{1n}$, $X_{21}$-$X_{2n}$, ..., $X_{j1}$-$X_{jn}$ are respectively normalized so that average=0 and SD=1, as given by, for example, the following equation:

$$X_{11} = \frac{x_{11} - \bar{x}_1}{\sigma_1} \quad (2)$$

In Eq. (2), $\sigma_1$ is the standard deviation.

The data processing section 52 then calculates a Mahalanobis distance $D^2$ of the normalized magnet data for determining whether the magnet is normal or not, based on the following equation:

$$D^2 = \frac{1}{n} X(X_1, X_2, \ldots, X_n)(A^{-1}) \begin{pmatrix} x_1 \\ x_2 \\ \vdots \\ x_n \end{pmatrix} \quad (3)$$

The data processing section 52 compares the calculated Mahalanobis distance $D^2$ with stored data in the database 53 in which magnet data are previously sampled from a normally operating magnet and developed into a Mahalanobis reference space, to determine whether the operating condition of the superconductive magnet is normal or not, and displays the result on the display section 55, for example.

FIG. 8 shows exemplary elements developed by the data processing section 52.

In the present embodiment, the matrix is generated using a Mahalanobis-Taguchi system (MTS).

In the example shown in FIG. 8, elements obtained by developing the helium level as the parameter are: X1: helium level; X2: moving average of X1 for 12 hours (Hanning window); X3: differential calculus of X1; X4: moving average of X3; X5: trend of moving average data X2; X6: differential calculus of X5; X7: integral calculus of X5; X8: integral calculus of X6; X9: twelve-point means of X3; X10: integral of X9; sum of squares of X9; X76: long-term (one week) trend; and X81: long-term regression of the helium level and helium gas pressure.

Also in the example of FIG. 8, elements obtained by developing the second temperature of the second stage as the parameter are: X12: (the temperature of the second stage X22): (sum of squares of X20); and X77: long-term (one week) trend.

Moreover, in the example of FIG. 8, elements obtained by developing the first temperature of the first stage as the parameter are: X23: (the temperature of the first stage X33): (sum of squares of X31); and X78: long-term (one week) trend.

In the example of FIG. 8, elements obtained by developing the temperature of the equipment room as the parameter are: X34: (the temperature of the equipment room X44): (sum of squares of X42); and X79: long-term (one week) trend.

Finally, in the example of FIG. 8, elements obtained by developing the helium gas pressure as the parameter are: X45: (the helium gas pressure X44): (sum of squares of X53); and X80: long-term (one week) trend.

Although five parameters are resolved into a plurality of (j, e.g., several tens of) elements in this embodiment, not all of these elements need be used and it is sufficient to determine the operating condition of the superconductive magnet by generating a matrix using, for example, 26 parameters and calculating the Mahalanobis distance $D^2$.

The case in which the 26 parameters are selected will be described hereinbelow.

Define the five parameters as $x_1(t)$, $x_2(t)$, $x_3(t)$, $x_4(t)$ and $x_5(t)$.

The five original parameters $x_1(t)$-$x_5(t)$ are developed into several tens of elements (parameters). Note that $x_{ij}$ (i=1–5, j=1–12) and $x_{113}(t)$ can be expressed in this case. Here, $x_{113}(t)$ is a special parameter representing the long-term slope of $x_{13}$.

Then, parameters $x_{12}$, $x_{15}$, $x_{18}$, $x_{110}$ and $x_{112}$ are selected among parameters obtained by developing the parameter $x_1$.

Moreover, parameters $x_{22}$, $x_{23}$, $x_{25}$, $x_{210}$ and $x_{212}$ are selected among parameters obtained by developing the parameter $x_2$.

Parameters $x_{32}$, $x_{35}$, $x_{38}$, $x_{310}$, $x_{311}$ and $x_{312}$ are selected among parameters obtained by developing the parameter $x_3$.

Parameters $x_{42}$, $x_{44}$, $x_{49}$, $x_{410}$ and $x_{412}$ are selected among parameters obtained by developing the parameter $x_4$.

Finally, parameters $x_{52}$, $x_{54}$, $x_{55}$, $x_{58}$ and $x_{512}$ are selected among parameters obtained by developing the parameter $x_5$.

The database 53 stores data obtained by resolving the pressure data for the cooling helium gas, level (remaining amount) data for the liquid helium, first temperature data for the first stage of the refrigerator, second temperature data for the second stage of the refrigerator, and third temperature (room temperature) data for the equipment room 13 in which the compressor 40 is placed that have been previously sampled from the normally operating magnet, as prespecified parameters, into a plurality of elements, as described above, and developing magnet data including the resolved elements into a Mahalanobis reference space.

Figure 9:
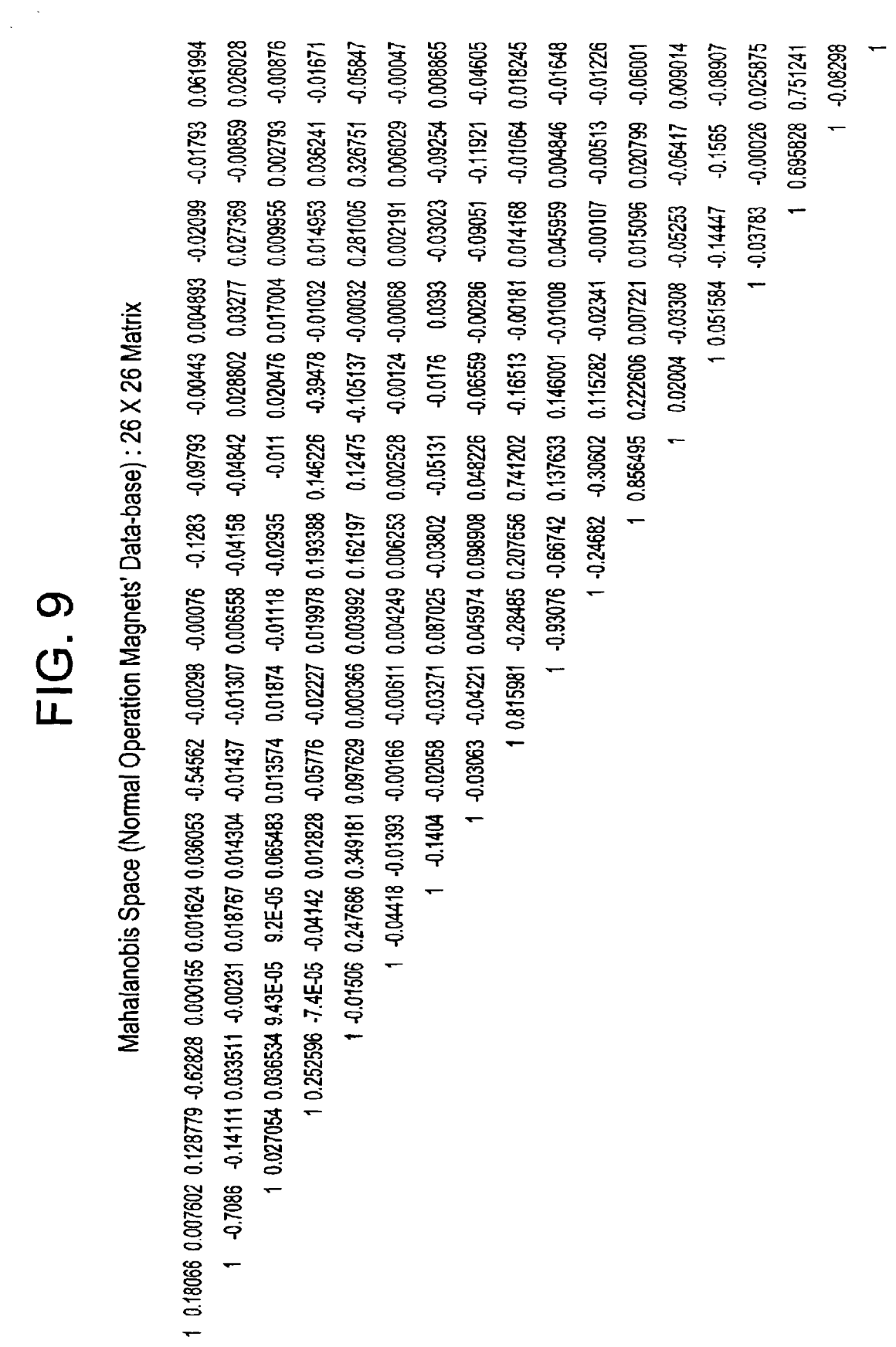

FIG. 9 shows exemplary data stored in the database 53 developed into the Mahalanobis reference space.

The example shown in FIG. 9 corresponds to the above-described case in which the 26 parameters are selected, and the data are given in a 26×26 matrix.

FIG. 10 shows the Taguchi-SNR($\eta$) value for predetermined factors corresponding to the data shown in FIG. 9, and also shows exemplary determination criterion.

In FIG. 10, factors marked by double circles, single circles and triangles are meant to be usable, and those marked by crosses are meant to be unusable.

FIG. 10 demonstrates that the Taguchi-SNR($\eta$) increases to 4.99 dB. This indicates that a sensitivity of a factor of 3.2 is provided.

Such data in the database 53 are used as data for comparison with the Mahalanobis distance obtained by the data processing section 52 as described above to determine whether the operating condition of the superconductive magnet is normal or not.

The operating section 54 is comprised of a keyboard with pointing device, and a mouse etc., and outputs an operation signal in response to the operation by the operator OP to the data processing section 52. The operating section 54 also receives input commands and information on maintenance, for example.

The display section 55 is comprised of a graphic display, for example, and displays the processing status of the data processing section 52 and the determination result of the operating condition of the superconductive magnet etc. in response to the operation signal from the operating section 54.

Now the operation of the above-stated configuration will be described with reference to flow charts shown in FIGS. 11 and 12.

Figure 11:
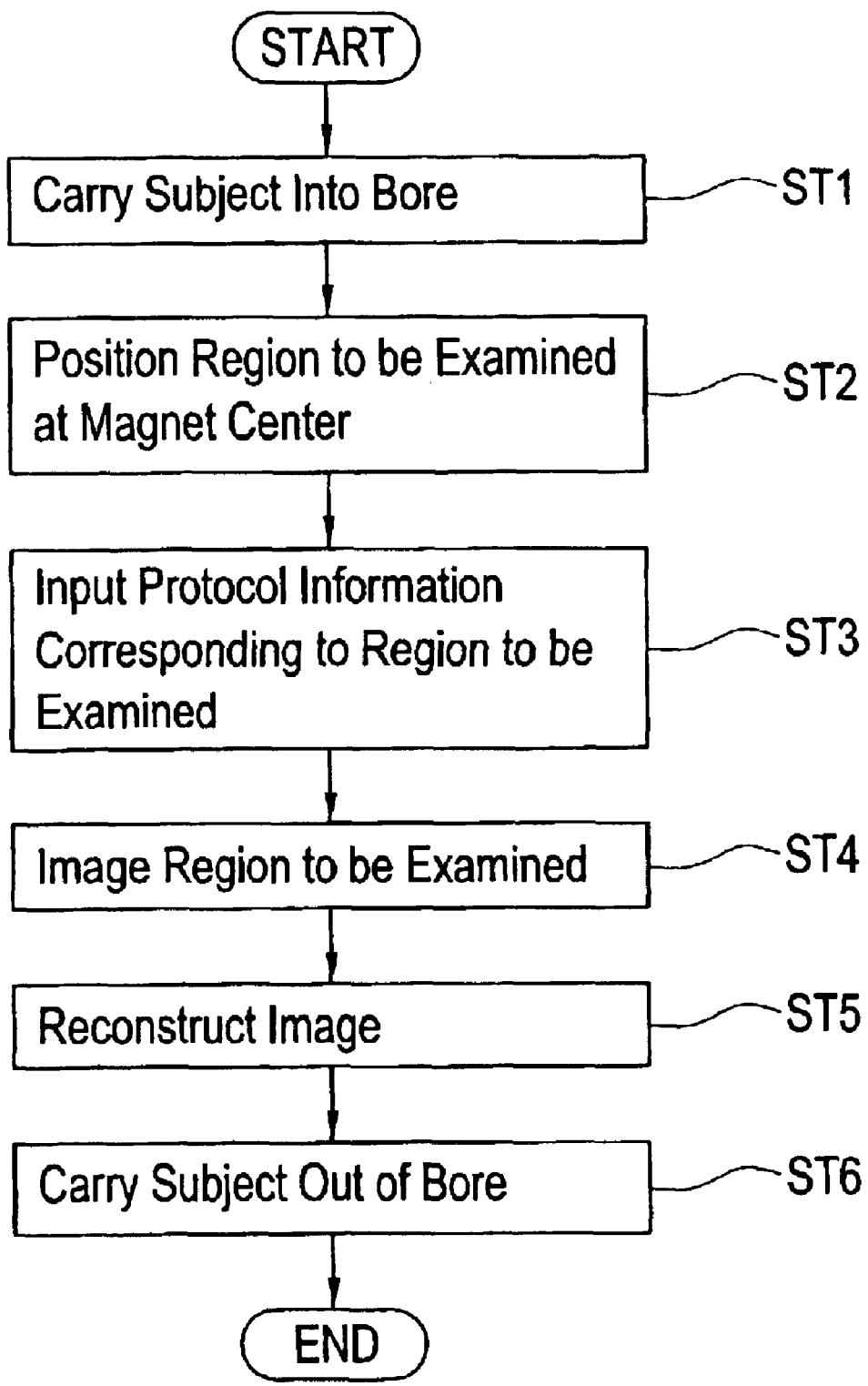
FIG. 11 is a flow chart for explaining the operation of the embodiment.
Figure 12:
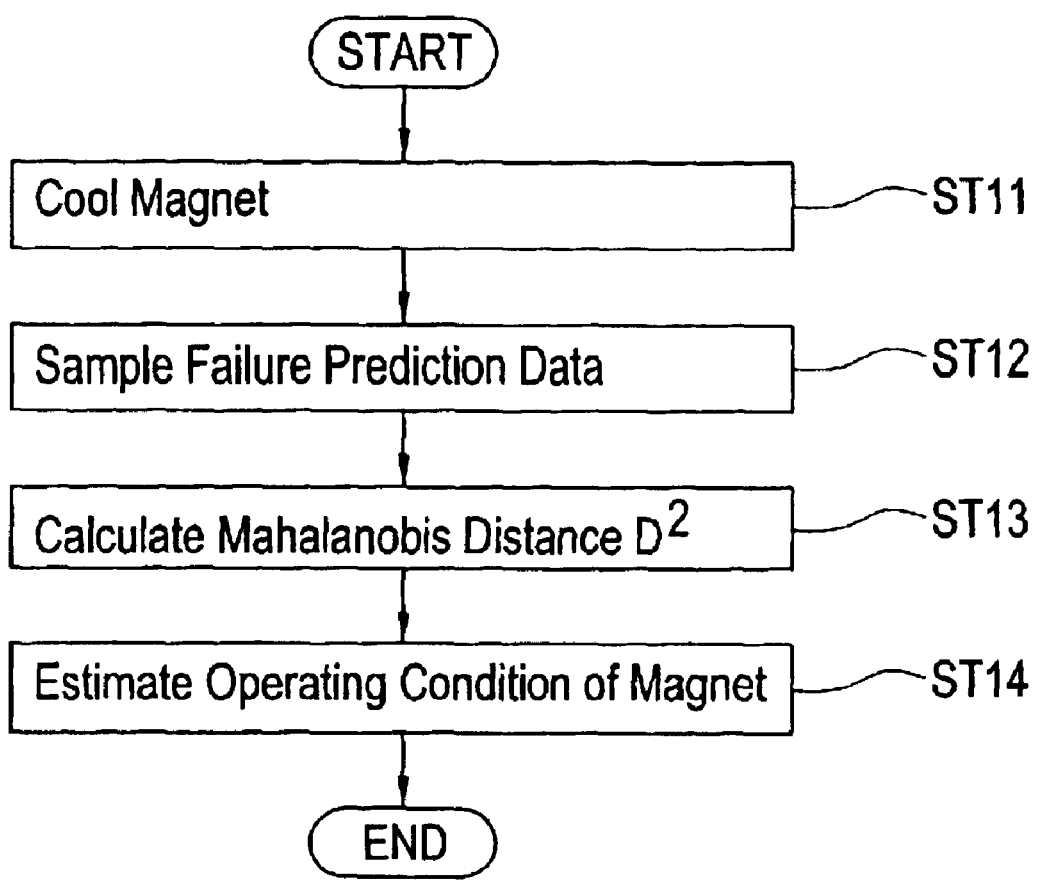
FIG. 12 is a flow chart for explaining the operation of the embodiment.

As shown in FIG. 11, the subject 60 rested on the cushion over the cradle 26 is first carried into the bore 211 of the magnet system 21 in the MRI apparatus 20 by the carrier section (not shown) (ST1).

Next, a region to be examined in the subject 60 is positioned at the magnet center of the bore 211 (ST2). At this time, a static magnetic field is generated in a predefined region in the bore 211 including the magnet center by the main magnetic field magnet section 212.

The operator OP then inputs protocol information corresponding to the region to be examined via the operating section 32 (ST3).

The protocol information (e.g. protocol number) input from the operating section 32 is supplied to the control section 25 by the data processing section 31.

The control section 25 controls the RF driving section 22 to apply to the RF coil section 214 a driving signal DR1 for repeating a predetermined pulse sequence a predetermined number of times in a predetermined repetition time TR, based on the protocol to be executed corresponding to the region to be examined in the subject 60 sent by the data processing section 31 in the operator console 30. The control section 25 also controls the gradient driving section 23 to apply to the gradient coils 213 a pulse signal of a predetermined pattern in 1TR based on the protocol to be executed.

The RF driving section 22 applies the driving signal DR1 corresponding to the protocol based on the command from the control section 25 to the RF coil section 214; and the gradient driving section 23 applies the driving signal DR2 corresponding to the protocol based on the command from the control section 25 to the gradient coil section 213.

Gradient magnetic fields and a high frequency magnetic field are thus generated in the predefined region in the bore 211 including the magnet center; electromagnetic wave generated by excited spins within the region to be examined in the subject 60 are gathered as magnetic resonance signals; and the magnetic resonance signals are collected by the data collecting section 24; and the collected data are output to the data processing section 31 in the operator console 30 as examination result data.

That is, imaging of the region to be examined is conducted (ST4).

The data processing section 31 stores data supplied by the data collecting section 24 in a memory, in which a data space is formed. The data processing section 31 performs two-dimensional inverse Fourier transformation on the data in the two-dimensional Fourier space to produce (reconstruct) an image of the region to be examined in the subject 60 (ST5).

After the data collection for the region to be examined in the subject 60 has been completed, the subject 60 is carried out of the bore 211 along with the cradle 26 by the carrier section (not shown) (ST6).

At the time of imaging the region to be examined in the subject 60 as described above, cryogen helium cooled by the compressor 40 placed in the equipment room 13 is supplied to the cold head 2001a of the refrigerator 2001 via the cryogen supply path 411.

The supplied helium gas is adiabatically expanded at the first stage 2001d of the cold head 2001a. At this time, the vessel itself is cooled.

The helium gas vaporized in the vessel is cooled at the second stage 2001e back to liquid helium, and the liquid helium is supplied to the region 2013 in which the superconductive coil is placed. When cooled by the liquid helium of a temperature of −268.8° C., the superconductive coil becomes superconductive, enabling it to pass electric current at a low resistance and thereby generate the static magnetic field in the bore 211 (ST11).

The warmed helium gas that has been used for the cooling is returned from the cold head 2001a to the compressor 40 via the cryogen return path 412. For the magnetic resonance imaging system employing the superconductive magnet, failure prediction data is sampled which is needed to estimate the operating condition of the superconductive magnet, and to conduct prediction of a potential failure that, upon occurrence, would cause the user significant loss (ST12).

Specifically, pressure data for the cooling helium gas is detected (sampled) by the pressure sensor 71, level (remaining amount) data for the liquid helium is detected by the level sensor 72, first temperature data for the first stage of the refrigerator is detected by the first temperature sensor 73, second temperature data for the second stage of the refrigerator is detected by the second temperature sensor 74, and third temperature (room temperature) data for the equipment room 13 in which the compressor 40 is placed is detected by the third temperature sensor 75.

The pressure data for the cooling helium gas detected by the pressure sensor 71, level (remaining amount) data for the liquid helium detected by the level sensor 72, first temperature data for the first stage of the refrigerator detected by the first temperature sensor 73, second temperature data for the second stage of the refrigerator detected by the second temperature sensor 74, and third temperature (room temperature) data for the equipment room 13 in which the compressor 40 is placed detected by the third temperature sensor 75 are input to the data processing section 31, and transmitted to the central management center 50 via the modem 34.

In the central management center 50, the modem 51 receives the pressure data for the cooling helium gas, level (remaining amount) data for the liquid helium, first temperature data for the first stage of the refrigerator, second temperature data for the second stage of the refrigerator, and third temperature (room temperature) data for the equipment room 13 in which the compressor 40 is placed, all of which are transmitted by the operator console 30 via the modem 51, and supplies the data to the data processing section 52.

The data processing section 52 retains the pressure data for the cooling helium gas, level (remaining amount) data for the liquid helium, first temperature data for the first stage of the refrigerator, second temperature data for the second stage of the refrigerator, and third temperature (room temperature) data for the equipment room 13 in which the compressor 40 is placed, all of which are input via the modem 51, in a FIFO or other such memory for a certain time (e.g., several tens—several hundreds of hours). The data are resolved as prespecified parameters into a plurality of elements, and a predefined matrix employing the elements as magnet data is generated.

The data processing section 52 then calculates the Mahalanobis distance D2 of the normalized magnet data for determining whether the magnet is normal or not (ST13).

The data processing section 52 compares the calculated Mahalanobis distance $D^2$ with stored data in the database 53 obtained by developing magnet data previously sampled from a normally operating magnet into a Mahalanobis reference space, to determine whether the operating condition of the superconductive magnet is normal or not (ST14).

The result of the determination is displayed on the display section 55, for example.

Figure 13:
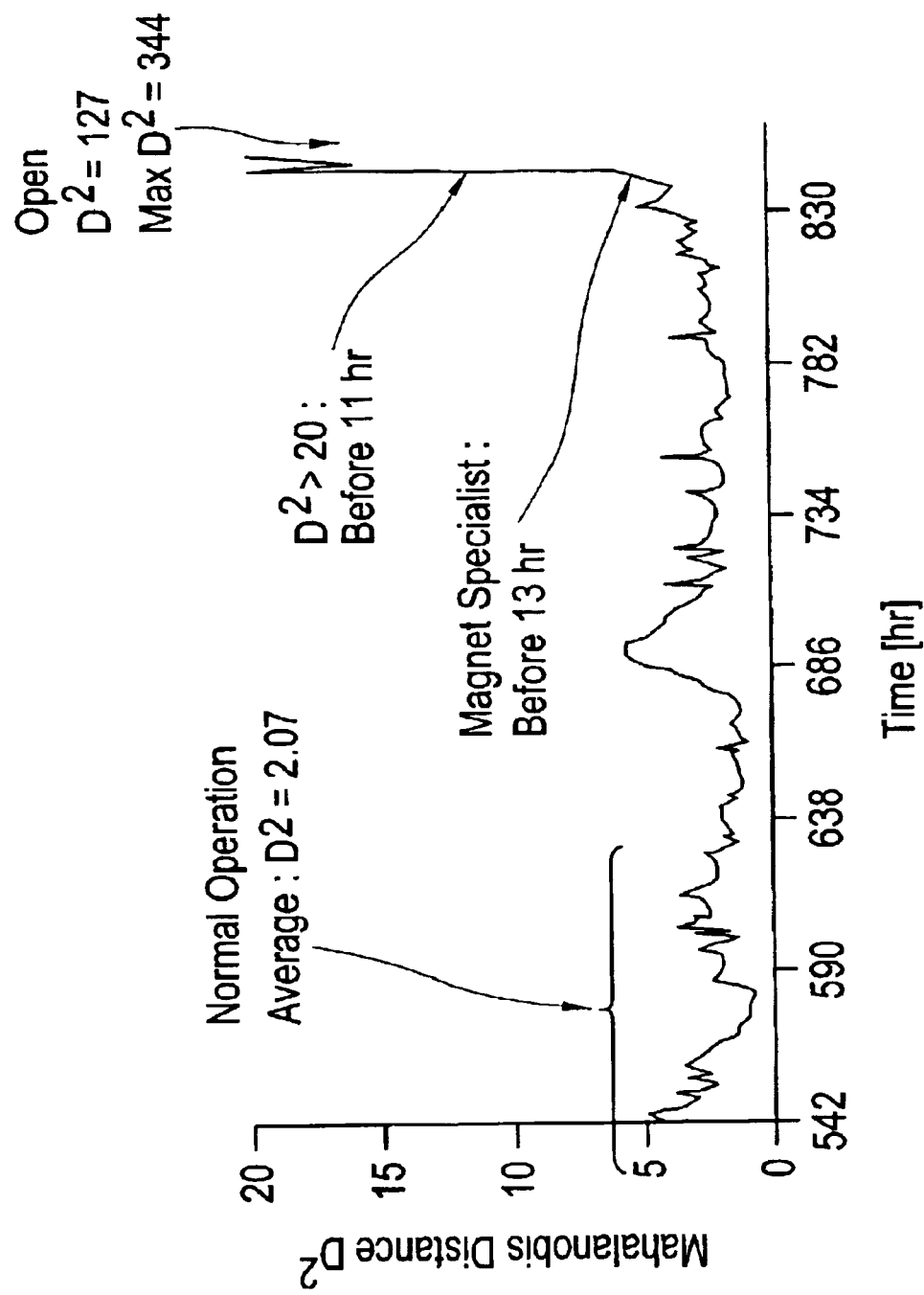
FIG. 13 shows a temporal change of the Mahalanobis distance $D^2$ calculated based on five classes of failure prediction data.

FIG. 13 shows a temporal change of the Mahalanobis distance $D^2$ calculated based on the five classes of failure prediction data as described above.

As shown in FIG. 13, the average of the Mahalanobis distance $D^2$ is 2.07 in the normal operating condition.

A Mahalanobis distance $D^2$ of greater than 15 can be considered to be indication of a deteriorating condition in the superconductive magnet.

In the example of FIG. 13, an abnormal operating condition can be predicted 11 hours before, for example, the valve erroneously opens.

Moreover, some latent faulty factor can be predicted 13 hours before, for example, the valve erroneously opens.

As described above, according to the present invention, by providing the data processing section 52 for resolving pressure data for the cooling helium gas, level (remaining amount) data for the liquid helium, first temperature data for the first stage of the refrigerator, second temperature data for the second stage of the refrigerator, and third temperature (room temperature) data for the equipment room 13 in which the compressor 40 is placed, as prespecified parameters, into a plurality of elements, generating a predefined matrix using the elements as magnet data, calculating the Mahalanobis distance $D^2$ of the normalized magnet data, comparing the calculated Mahalanobis distance $D^2$ with data stored in the database 53 obtained by developing magnet data previously sampled from a normally operating magnet into the Mahalanobis reference space to determine whether the operating condition of the superconductive magnet is normal or not, the operating condition of the magnet can be easily estimated by a technician of any skill level, and there is provided the advantage that a potential failure can be accurately predicted beforehand.

Although the above-described embodiment is configured to transmit sampled data to the data processing section 52 in the remote central management center 50, calculate the Mahalanobis distance $D^2$ by the data processing section 52, and compare the Mahalanobis distance $D^2$ with data in the database to estimate the operating condition, the present invention is not limited such a configuration.

Figure 14:
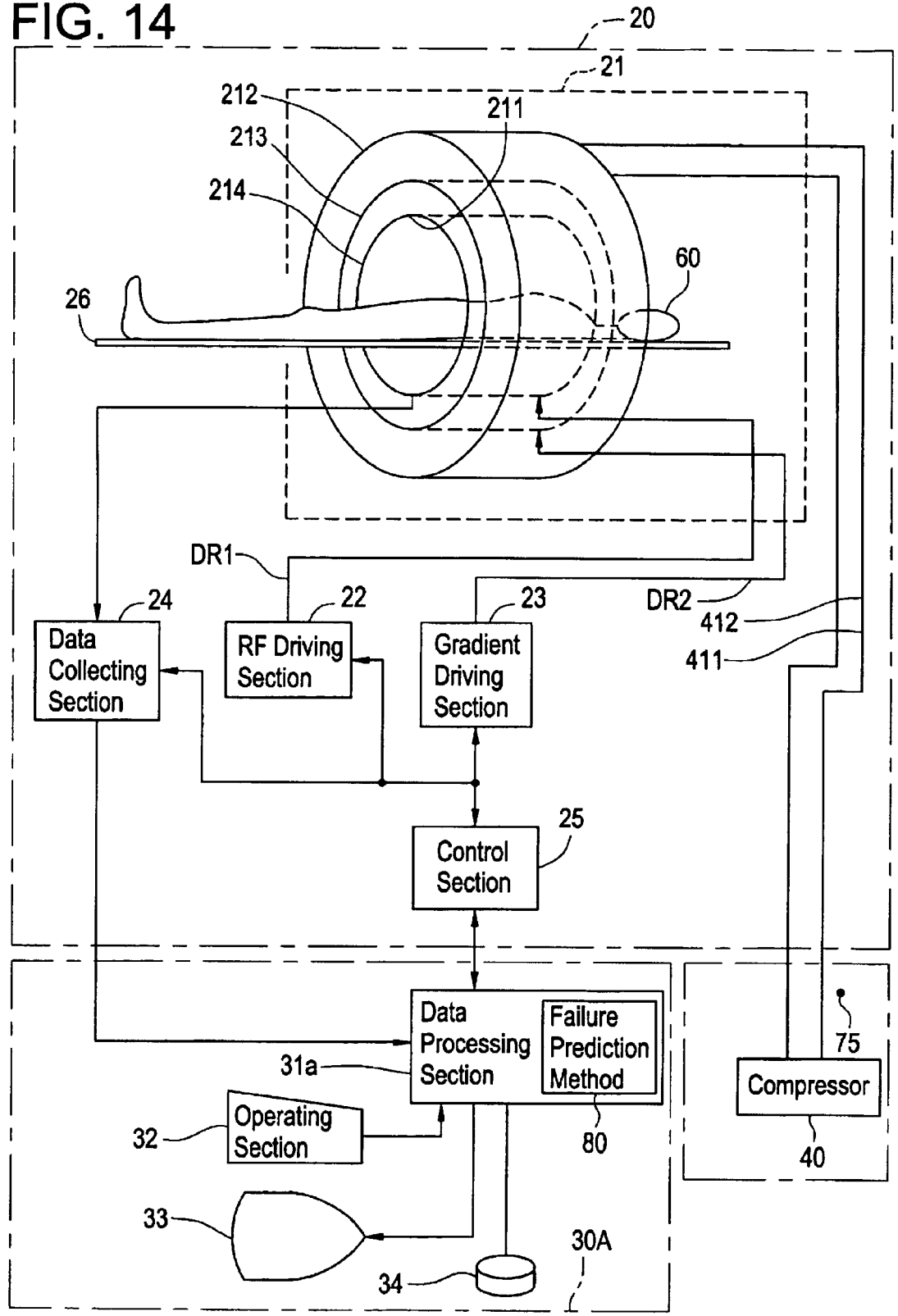
FIG. 14 is a configuration diagram showing another embodiment of an MRI system in accordance with the present invention.

For example, it is possible to connect a database 34 to a data processing section 31A n an operator console 30A, as shown in FIG. 14, calculate the Mahalanobis distance $D^2$ at the data processing section 31A, and compare the Mahalanobis distance $D^2$ with data in the database 34 to estimate the operating condition. The data processing section 31A executes the failure prediction method 80 for predicting a failure of a superconducting magnet.

Many widely different embodiments of the invention may be configured without departing from the spirit and the scope of the present invention. It should be understood that the present invention is not limited to the specific embodiments described in the specification, except as defined in the appended claims.

What is claimed is:

1. A failure prediction apparatus for predicting a failure of a superconductive magnet for forming a static magnetic field space employed in a magnetic resonance imaging apparatus, comprising:
    a pressure sensor for detecting a pressure of a cooling medium in said superconductive magnet;
    a level sensor for detecting a level of said cooling medium;
    a first temperature sensor for detecting a temperature of a predefined portion of a refrigerator;
    a second temperature sensor for detecting a temperature of a room in which a compressor is placed for cooling the cooling medium from said refrigerator and supplying the cooling medium to said refrigerator; and
    a calculating device for calculating a Mahalanobis distance of magnet data including, as prespecified parameters, the pressure of the cooling medium detected by said pressure sensor, the level of the cooling medium detected by said level sensor, the temperature of the refrigerator detected by said first temperature sensor, and the room temperature detected by said second temperature sensor for determining whether the magnet is normal or not.

2. The failure prediction apparatus for a superconductive magnet of claim 1, wherein
    said calculating device resolves the pressure of the cooling medium detected by said pressure sensor, the level of the cooling medium detected by said level sensor, the temperature of the refrigerator detected by said first temperature sensor, and the room temperature detected by said second temperature sensor, as the prespecified parameters, into a plurality of elements, normalizes the elements to form magnet data, and calculates the Mahalanobis distance of the normalized magnet data for determining whether the magnet is normal or not.

3. The failure prediction apparatus for a superconductive magnet of claim 2, comprising;
    a database storing data obtained by resolving magnet data previously sampled from a normally operating magnet including, as prespecified parameters, a pressure of the cooling medium detected by said pressure sensor, a level of the cooling medium detected by said level sensor, a temperature of the refrigerator detected by said first temperature sensor, and a room temperature detected by said second temperature sensor, into a plurality of elements, and developing the resolved magnet data comprised of the plurality of elements into a Mahalanobis reference space; and
    a device for determining whether the operating condition of the superconductive magnet is normal or not by comparing the Mahalanobis distance obtained by said calculating device with the stored data in said database.

4. The failure prediction apparatus for a superconductive magnet of claim 1, comprising:
    a database storing data obtained by developing magnet data previously sampled from a normally operating magnet including, as prespecified parameters, a pressure of the cooling medium detected by said pressure sensor, a level of the cooling medium detected by said level sensor, a temperature of the refrigerator detected by said first temperature sensor, and a room temperature detected by said second temperature sensor, into a Mahalanobis reference space; and
    a device for determining whether the operating condition of the superconductive magnet is normal or not by comparing the Mahalanobis distance obtained by said calculating device with the stored data in said database.

5. A magnetic resonance imaging system comprising:
    a superconducting magnet for forming a static magnetic field space;
    a data processing section for forming an image of a region within a subject placed within the static magnetic field space;
    a failure prediction apparatus for the superconductive magnet, including: a pressure sensor for detecting a pressure of a cooling medium in said superconductive magnet; a level sensor for detecting a level of said cooling medium; a first temperature sensor for detecting a temperature of a predefined portion of a refrigerator; a second temperature sensor for detecting a temperature of a room in which a compressor is placed for cooling the cooling medium from said refrigerator and supplying the cooling medium to said refrigerator; and a calculating device for calculating a Mahalanobis distance of magnet data including, as prespecified parameters, the pressure of the cooling medium detected by said pressure sensor, the level of the cooling medium detected by said level sensor, the temperature of the refrigerator detected by said first temperature sensor, and the room temperature detected by said second temperature sensor for determining whether the magnet is normal or not.

6. The magnetic resonance imaging system of claim 5, wherein said calculating device resolves the pressure of the cooling medium detected by said pressure sensor, the level of the cooling medium detected by said level sensor, the temperature of the refrigerator detected by said first temperature sensor, and the room temperature detected by said second temperature sensor, as the prespecified parameters, into a plurality of elements, normalizes the elements to form magnet data, and calculates the Mahalanobis distance of the normalized magnet data for determining whether the magnet is normal or not.

7. The magnetic resonance imaging system of claim 6, wherein said failure prediction apparatus comprises:

a database storing data obtained by resolving magnet data previously sampled from a normally operating magnet including, as prespecified parameters, a pressure of the cooling medium detected by said pressure sensor, a level of the cooling medium detected by said level sensor, a temperature of the predefined portion of the refrigerator detected by said first temperature sensor, and a room temperature detected by said second temperature sensor, into a plurality of elements, and developing the resolved magnet data comprised of the plurality of elements into a Mahalanobis reference space; and a device for determining whether the operating condition of the superconductive magnet is normal or not by comparing the Mahalanobis distance obtained by said calculating device with the stored data in said database.

8. The magnet resonance imaging system of claim 5, wherein said failure prediction apparatus comprises:

a database storing data obtained by developing magnet data previously sampled from a normally operating magnet including, as prespecified parameters, a pressure of the cooling medium detected by said pressure sensor, a level of the cooling medium detected by said level sensor, a temperature of the predefined portion of the refrigerator detected by said first temperature sensor, and the room temperature detected by said second temperature sensor, into a Mahalanobis reference space; and a device for determining whether the operating condition of the superconductive magnet is normal or not by comparing the Mahalanobis distance obtained by said calculating device with the stored data in said database.

9. A magnetic resonance imaging system employing a superconductive magnet for forming a static magnetic field space, receiving a subject into said static magnetic field, and imaging a region to be examined in the subject using magnetic resonance, comprising:

a failure prediction apparatus for the superconductive magnet, including: a pressure sensor for detecting a pressure of a cooling medium in said superconductive magnet; a level sensor for detecting a level of said cooling medium; first and second temperature sensors for detecting temperatures of a plurality of portions of a refrigerator; a third temperature sensor for detecting a temperature of a room in which a compressor is placed for cooling the cooling medium from said refrigerator and supplying the cooling medium to said refrigerator; and a calculating device for calculating a Mahalanobis distance of magnet data including, as prespecified parameters, the pressure of the cooling medium detected by said pressure sensor, the level of the cooling medium detected by said level sensor, the temperatures of the plurality of portions of the refrigerator detected by said first and second temperature sensors, and the room temperature detected by said third temperature sensor for determining whether the magnet is normal or not.

10. The magnetic resonance imaging system of claim 9, wherein said calculating device resolves the pressure of the cooling medium detected by said pressure sensor, the level of the cooling medium detected by said level sensor, the temperatures of the plurality of portions of the refrigerator detected by said first and second temperature sensors, and the room temperature detected by said third temperature sensor, as the prespecified parameters, into a plurality of elements, normalizes the elements to form magnet data, and calculates the Mahalanobis distance of the normalized magnet data for determining whether the magnet is normal or not.

11. The magnetic resonance imaging system of claim 10, wherein said failure prediction apparatus comprises:

a database storing data obtained by resolving magnet data previously sampled from a normally operating magnet including, as prespecified parameters, a pressure of the cooling medium detected by said pressure sensor, a level of the cooling medium detected by said level sensor, temperatures of the plurality of portions of the refrigerator detected by said first and second temperature sensors, and a room temperature detected by said third temperature sensor, into a plurality of elements, and developing the resolved magnet data comprised of the plurality of elements into a Mahalanobis reference space, and a device for determining whether the operating condition of the superconductive magnet is normal or not by comparing the Mahalanobis distance obtained by said calculating device with the stored data in said database.

12. The magnetic resonance imaging system of claim 9, wherein failure prediction apparatus comprises:

a database storing data obtained by developing magnet data previously sampled from a normally operating magnet including, as prespecified parameters, a pressure of the cooling medium detected by said pressure sensor, a level of the cooling medium detected by said level sensor, temperatures of the plurality of portions of the refrigerator detected by said first and second temperature sensors, and a room temperature detected by said third temperature sensor, into a Mahalanobis reference space; and a device for determining whether the operating condition of the superconductive magnet is normal or not by comparing the Mahalanobis distance obtained by said calculating device with the stored data in said database.

* * * * *